(12) United States Patent
Huang et al.

(10) Patent No.: US 8,358,059 B2
(45) Date of Patent: Jan. 22, 2013

(54) PHOSPHOR, WHITE LIGHT ILLUMINATION DEVICE AND SOLAR CELL UTILIZING THE SAME

(75) Inventors: Tien-Heng Huang, Yongkang (TW); Yao-Tsung Yeh, Taoyuan (TW); Fang-Ching Chang, Yongkang (TW); Shian-Jy Jassy Wang, Hsinchu County (TW)

(73) Assignee: Industrial Technology Research Institute, Hsinchu County (TW)

( * ) Notice: Subject to any disclaimer, the term of this patent is extended or adjusted under 35 U.S.C. 154(b) by 524 days.

(21) Appl. No.: 12/623,199

(22) Filed: Nov. 20, 2009

(65) Prior Publication Data
US 2010/0132789 A1    Jun. 3, 2010

Related U.S. Application Data

(63) Continuation-in-part of application No. 12/391,276, filed on Feb. 24, 2009, now abandoned.

(30) Foreign Application Priority Data

Dec. 2, 2008    (TW) ................... 97146729 A
Oct. 22, 2009   (TW) ................... 98135733 A

(51) Int. Cl.
*H01J 64/04*    (2006.01)
(52) U.S. Cl. ........ 313/503; 252/301.6 R; 252/301.4 R; 136/256; 372/43.01; 423/233
(58) Field of Classification Search ................ 313/503; 136/256; 252/301.6 R, 301.4 R; 372/43.01; 423/233
See application file for complete search history.

(56) References Cited

U.S. PATENT DOCUMENTS

| 7,064,480 | B2 | 6/2006 | Bokor et al. | |
| 7,239,082 | B2 | 7/2007 | Bokor et al. | |
| 2004/0007961 | A1* | 1/2004 | Srivastava et al. | 313/486 |
| 2005/0253114 | A1* | 11/2005 | Setlur et al. | 252/301.4 R |
| 2008/0018235 | A1* | 1/2008 | Wang et al. | 313/503 |

FOREIGN PATENT DOCUMENTS

| CN | 1444775 A | 9/2003 |
| CN | 101142296 A | 3/2008 |
| WO | 02/11211 A2 | 2/2002 |

OTHER PUBLICATIONS

First examination opinion notification issued by the China Intellectual Property Office on May 2, 2012, for the above-referenced application's counterpart application in China (Application No. 200910208735.2).

* cited by examiner

*Primary Examiner* — Shane Fang
(74) *Attorney, Agent, or Firm* — Pai Patent & Trademark Law Firm; Chao-Chang David Pai

(57) ABSTRACT

The invention provides phosphors composed of $Eu_{(1-x)}Ma_xMg_{(1-y)}Mb_yAl_{(10-z)}Mc_zO_{17}$, wherein Ma is Yb, SN, Pb, Ce, Tb, Dy, Pr, Ca, Sr, Ba, or combinations thereof, and $0 \leq x \leq 0.9$; Mb is Mn, Zn, or combinations thereof, and $0 \leq y \leq 0.7$; Mc is Ga, In, B, or combinations thereof, and $0 \leq z \leq 5$. These phosphors emit visible light under the excitation of ultraviolet light or blue light, and these phosphors may be further collocated with different color phosphors to provide a white light illumination device. Alternatively, the phosphors of the invention can improve the efficient utilization of the light in solar cell.

17 Claims, 10 Drawing Sheets

PHOSPHOR, WHITE LIGHT ILLUMINATION DEVICE AND SOLAR CELL UTILIZING THE SAME

CROSS REFERENCE TO RELATED APPLICATIONS

This Application is a Continuation-In-Part of pending U.S. patent application Ser. No. 12/391,276, filed on Feb. 24, 2009 and entitled "Phosphor and white light illumination device utilizing the same", which claims priority of Taiwan Patent Application No. 097146729, filed on Dec. 2, 2008, the entirety of which is incorporated by reference herein.

This Application claims priority of Taiwan Patent Application No. 098135733, filed on Oct. 22, 2009, which claims domestic priority of Taiwan Patent Application No. 097146729, filed on Dec. 2, 2008, the entirety of which is incorporated by reference herein.

BACKGROUND OF THE INVENTION

1. Field of the Invention

The present invention relates to phosphors, and in particular relates to white light illumination device and solar cells utilizing the same.

2. Description of the Related Art

White light emitting diodes is major stream of modern illumination due to its energy-saving, low pollution, and long lifetime. The critical points of total luminous efficiency in the illumination devices are not only LED inherent brightness but also the LED phosphors.

The general commercially available white light LED is blue LED (emission wavelength of 460 nm to 480 nm) collocating yellow phosphor, thereby having worse color-rendering. In addition, the yellow light comes from the yellow phosphor excited by the blue light from the blue LED chips. Because the blue light intensity is changed by different input current, the white light will tends to yellow or blue. Furthermore, the white light color will be uneven due to blue LED chips gradually damaged by time. For improving color-rendering and luminous efficiency, the UV light emitting diode is usually adopted with red, blue, and green phosphors. Because the excitation light source is invisible light, the white light color will not be influenced by excitation light source intensity decreasing.

In U.S. Pat. No. 7,064,480 and 7,239,082 and World Pat. No. 0211211, a blue-green phosphor aluminate $EuMgAl_{10}O_{17}$ is disclosed. The phosphor is excited by an major excitation peak of 396 nm to emit a blue-green light having a major emission peak of 477 nm. However, the strongest emission intensity of this phosphor is poor.

Accordingly, the phosphor composition should be tuned to enhance its strongest emission intensity. Moreover, pure red, pure green, and pure blue phosphors are called for.

BRIEF SUMMARY OF THE INVENTION

The invention provides a phosphor having a formula of $Eu_{(1-x)}Ma_xMg_{(1-y)}Mb_yAl_{(10-z)}Mc_zO_{17}$, wherein Ma is Yb, Sn, Pb, Ce, Tb, Dy, Pr, Ca, Sr, Ba, or combinations thereof, and $0 \leq x \leq 0.9$; Mb is Mn, Zn, or combinations thereof, and $0 < y \leq 0.7$; and Mc is Ga, In, B, or combinations thereof, and $0 \leq z \leq 5$.

The invention also provides a white light illumination device, comprising the phosphor as claimed in claim 1 and an excitation light source, wherein the excitation light source emits 200-400 nm UV or 400-420 nm blue light.

The invention further provides a solar cell, comprising a transparent substrate; an anode and a cathode on the bottom surface of the transparent substrate; and a semiconductor layer between the anode and the cathode; wherein the top surface of the transparent substrate has the described phosphor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
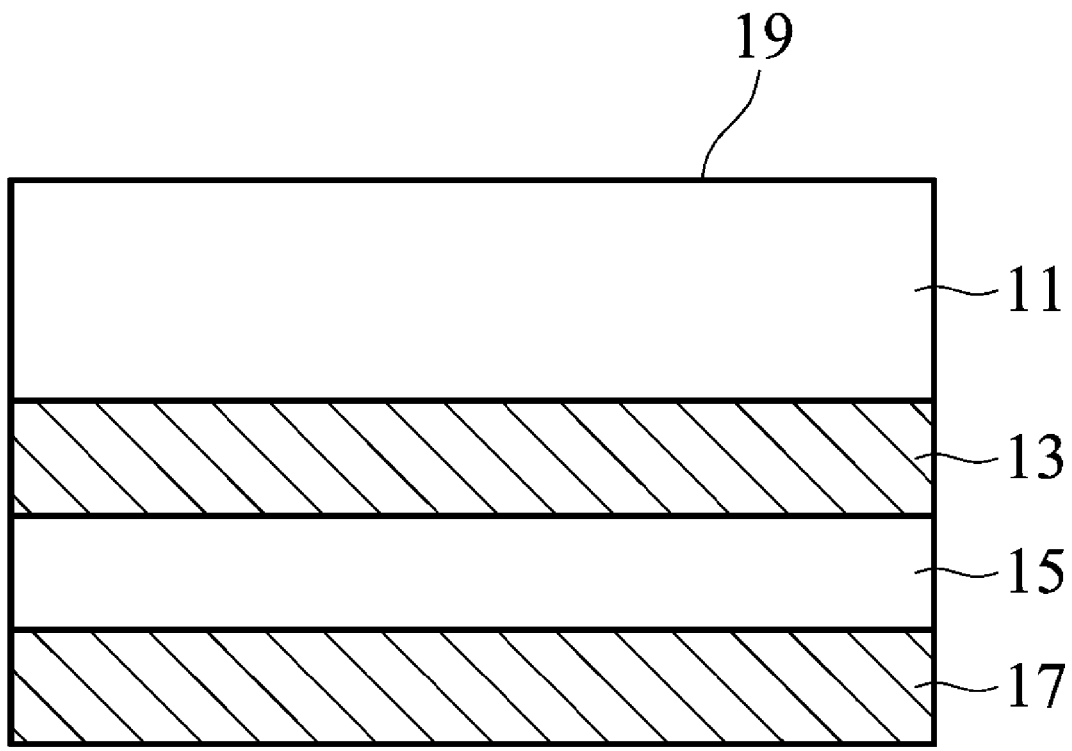
FIG. 1 shows the solar cell in one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides a phosphor having a formula: $Eu_{(1-x)}Ma_xMg_{(1-y)}Mb_yAl_{(10-z)}Mc_zO_{17}$, wherein Ma is Yb, Sn, Pb, Ce, Tb, Dy, Pr, Ca, Sr, Ba, or combinations thereof, and $0 \leq x \leq 0.9$; Mb is Mn, Zn, or combinations thereof, and $0 < y \leq 0.7$; and Mc is Ga, In, B, or combinations thereof, and $0 \leq z \leq 5$. In one embodiment, the phosphor is $EuMg_{(1-y)}Mn_yAl_{10}O_{17}$. In another embodiment, the phosphor is $EuMg_{0.8}Mn_{0.2}Al_{(10-z)}Ga_zO_{17}$, wherein $0 < z \leq 5$. In one embodiment, Mb is Mn, $Ma_x$ is $Md_pMe_q$, Md is Sn, Yb, Pb, Tb, Ce, Dy, Pr, or combinations thereof, and $0 < p \leq 0.5$. Me is Ca, Sr, Ba, or combinations thereof, and $0 \leq q \leq 0.9$. In this embodiment, $0 < p+q \leq 0.9$. In further embodiment, Mb is Mn, $Ma_x$ is $Md_pMe_q$, Md is Sn, Pb, Tb, Ce, Dy, Pr, or combinations thereof, and $0 < p \leq 0.5$. Me is Ca, Sr, Ba, or combinations thereof, and $0 \leq q \leq 0.9$. In this embodiment, $0 < p+q \leq 0.9$. In next embodiment, Mb is Mn, Ma is Sn, Yb, Pb, Tb, Ce, Dy, Pr, or combinations thereof, and $0<x\leq0.5$.

The phosphor can be excited by 200-400 nm UV or 400-420 nm blue light to emit a green light. The green light has a major emission peak of about 517 nm. The excitation light source applied to emit UV or blue light includes a light emitting diode or a laser diode.

The method for preparing the described phosphor is solid-reaction. First, the appropriate stoichiometry of reagents was weighted according to the element molar ratio of resulting phosphor: $Eu_{(1-x)}Ma_xMg_{(1-y)}Mb_yAl_{(10-z)}Mc_zO_{17}$, wherein Ma is Yb, Sn, Pb, Ce, Tb, Dy, Pr, Ca, Sr, Ba, or combinations thereof, Mb is Mn, Zn, or combinations thereof, and Mc is Ga, In, B, or combinations thereof. The reagents containing Eu, Mn, Zn, Yb, Sn, Pb, Ce, Tb, Dy, Pr, Ca, Sr, or Ba can be chlorides such as $EuCl_2$, oxides such as $Mn_3O_4$, ZnO, or MnO, carbonates such as $MnCO_3$, acetates such as $Mn(CH_3COO)_2$, or nitrate such as $Tb(NO_3)_3$. The reagents containing Mg can be oxides such as MgO, carbonates such as $MgCO_3$, or chlorides such as $MgCl_2$. The reagents containing Al, Ga, or In can be oxides such as $\gamma$-$Al_2O_3$, $Ga_2O_3$, or $In_2O_3$. The reagents containing boron can be boron oxide ($B_2O_3$) or boric acid ($H_3BO_3$). The described reagents of appropriate equivalent were evenly mixed and grinded, and charged in a crucible. The crucible was then heated in a high temperature furnace. After sintering at 1400-1700° C. for several hours, the described phosphor was prepared.

In one embodiment, the phosphor is excited by blue light or UV to emit green light. As such, the phosphor of the invention may collocate with UV excitable blue phosphor and UV/blue light excitable red phosphor. Arranged with an ultraviolet excitation light source such as a light-emitting diode or laser diode, a white light emitting diode or white laser diode is completed. The blue phosphor includes $BaMgAl_{10}O_{17}:Eu^{2+}$, $(Ba,Sr,Ca)_5(PO_4)_3(F,Cl,Br,OH):Eu^{2+}$, $2SrO*0.84P_2O_5*0.16B_2O_3:Eu^{2+}$, $Sr_2Si_3O_8*2SrCl_2:Eu^{2+}$, $(Mg,Ca,Sr,Ba,Zn)_3B_2O_6:Eu^{2+}$, or other suitable blue phosphors. The red phosphor includes $(Sr,Ca)S:Eu^{2+}$, $(Y,La,Gd,Lu)_2O_3:Eu^{3+}$, $Bi^{3+}$, $(Y,La,Gd,Lu)_2O_2S:Eu^{3+},Bi^{3+}$, $Ca_2Si_5N_8:Eu^{2+}$, ZnCdS:AgCl, or other suitable red phosphors. The red and blue phosphors can be divided into being directly or indirectly excitable. If the red, green, and blue phosphors are near UV excitable, they are directly excited by an excitation light source such as a light emitting diode or laser diode. If the red and green phosphors are blue light excitable, they are indirectly excited by blue light. The blue light is emitted from the blue phosphor excited by an excitation light source such as a light emitting diode or laser diode. The combination and ratio of red, green, and blue phosphors are optional in different applications of direct or indirect excitation.

In the white light illumination device as described above, a white light emitting diode or white laser diode, and the red/green/blue phosphors can be evenly mixed in preferable ratio and dispersed in an optical gel. The optical gel containing the phosphors may further seal a near UV excitation light source such as a chip of a light emitting diode or a laser diode. Note that if UV is selected as the excitation light source, an UV filter or other UV insulator should be arranged externally from the white light illumination device to protect user's eyes and skin.

Besides white light emitting diode, the UV excitable phosphor of the invention can be applied to a solar cell. As shown in FIG. 1, a typical solar cell includes a transparent substrate 11. An anode 13, a semiconductor layer 15, and a cathode 17 are sequentially formed on the transparent substrate 11. In general, the transparent substrate 11 is glass, plastic, or synthetic resin. The anode 13 is a transparent conductive layer such as indium tin oxide (ITO), zinc oxide, tin fluoride oxide, or combinations thereof. The semiconductor layer 15 can be single or multi-layered PIN structure including p-type doped (so called P layer), non-doped (so-called I layer), and n-type doped (so-called N layer) semiconductor material. The semiconductor material can be hydrogenated amorphous silicon or hydrogenated microcrystalline silicon. The cathode 17 is aluminum, silver, molybdenum, platinum, copper, gold, iron, niobium, titanium, chromium, bismuth, antimony, and the likes. Most of the semiconductor layers utilize visible light other than higher energy UV. The phosphor of the invention can be formed on top surface 19 of the transparent substrate 11, thereby transforming UV to visible green light to enhance the light efficient utilization of the semiconductor layer 15 in the solar cell.

EXAMPLES

Example 1

Figure 2:
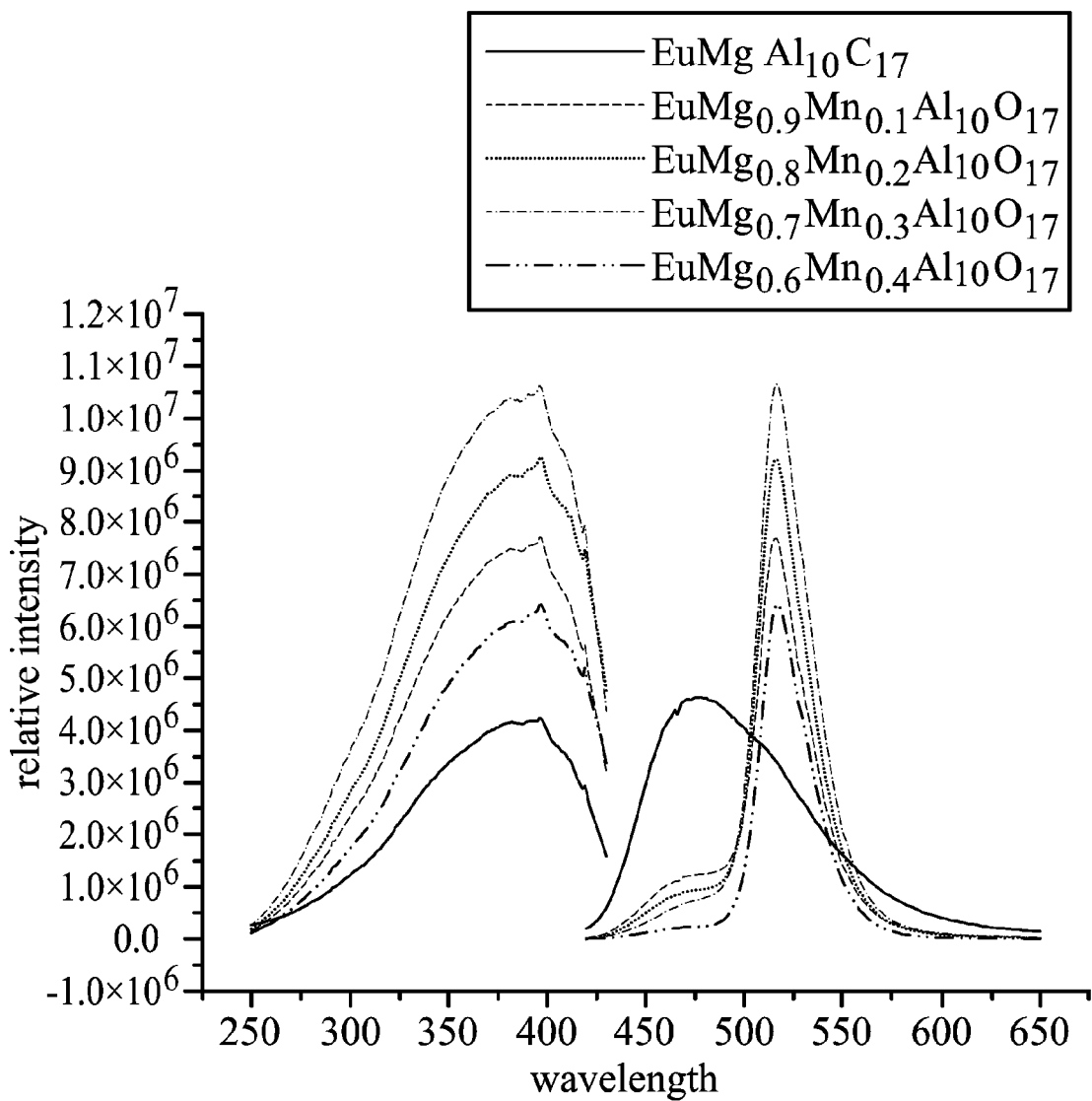
FIG. 2 shows the comparison between the emission spectra of the phosphor $EuMg_{1-y}Mn_yAl_{10}O_{17}$ in the invention and the conventional phosphor $EuMgAl_{10}O_{17}$.
Figure 3:
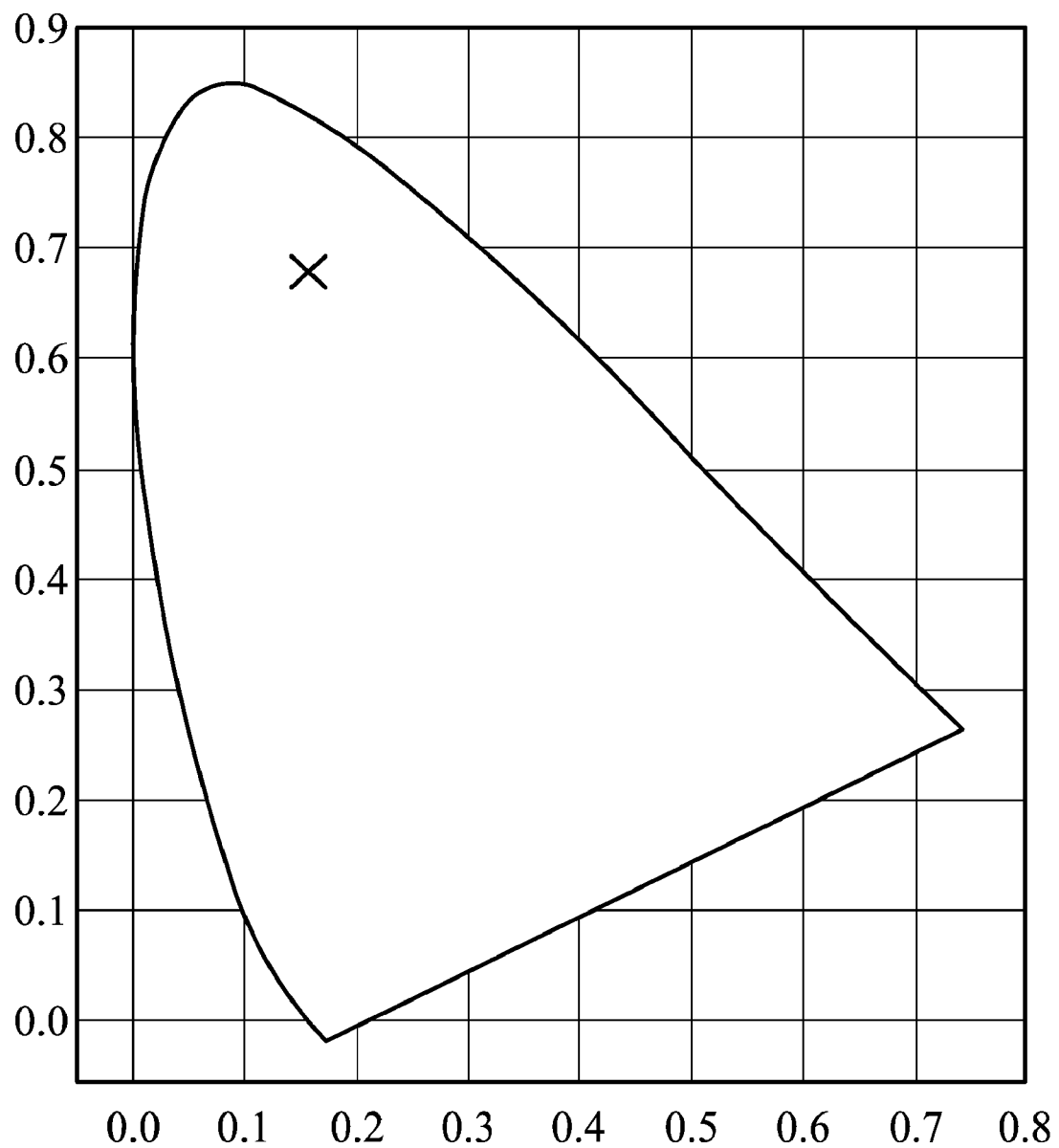
FIG. 3 shows a CIE diagram of the phosphor $EuMg_{0.9}Mn_{0.1}Al_{10}O_{17}$ in one embodiment of the invention.
Figure 4:
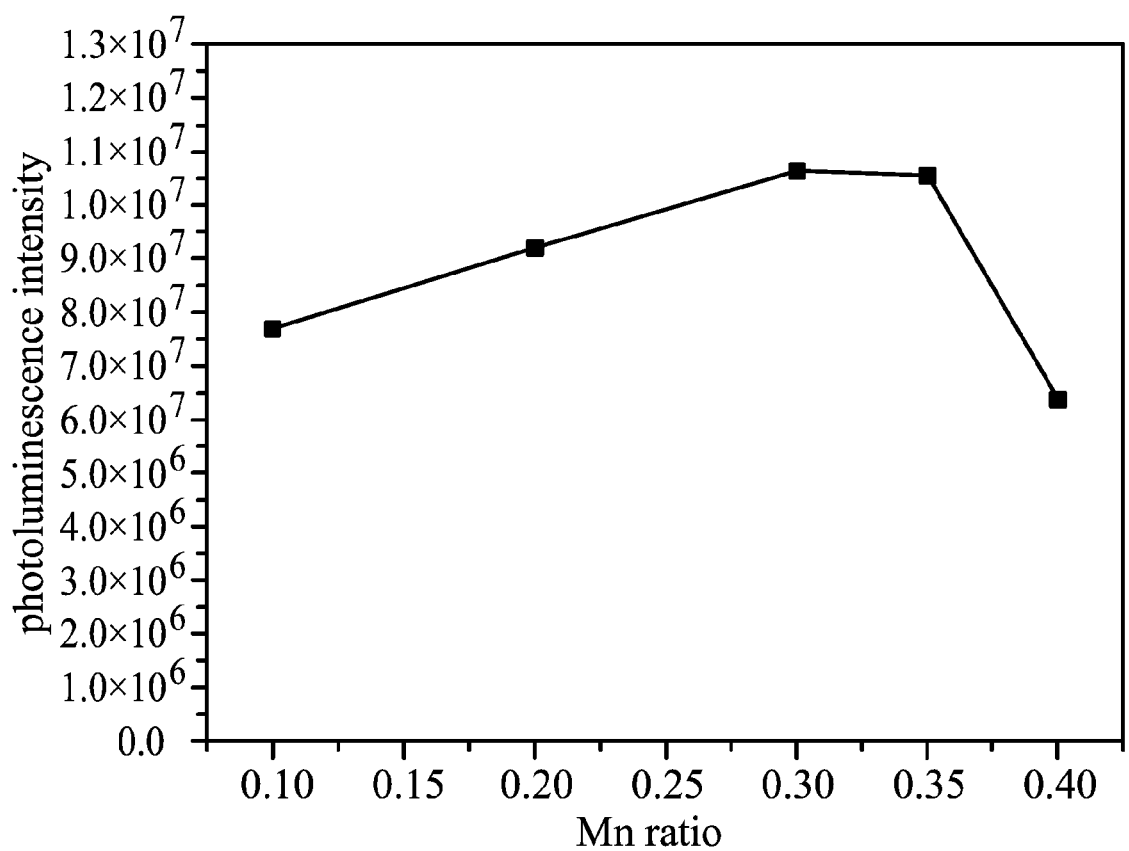
FIG. 4 shows the different photoluminescence intensities of $EuMg_{1-y}Mn_yAl_{10}O_{17}$ with different y ratio.

According to chemical stoichiometry, the appropriate amount of $Eu_2O_3$ (commercially available from Aldrich Chemicals Company Inc. in U.S.A., 99.99%, FW=351.92), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), and $Al_2O_3$ (commercially available from Aldrich Chemicals Company Inc. in U.S.A., >99.9%, FW=101.96) were evenly mixed and grinded, charged in a crucible, and heated in a high temperature furnace. After sintering at 1600° C. for about 8 hours under 5% $H_2/N_2$, the phosphor $EuMg_{0.9}Mn_{0.1}Al_{10}O_{17}$, $EuMg_{0.8}Mn_{0.2}Al_{10}O_{17}$, $EuMg_{0.7}Mn_{0.3}Al_{10}O_{17}$, and $EuMg_{0.6}Mn_{0.4}Al_{10}O_{17}$ were prepared. The emission spectra comparison of the above products and conventional phosphor $EuMgAl_{10}O_{17}$ was shown in FIG. 2. The described phosphors have a major excitation peak of 396 nm and a major emission peak of 515 nm to 517 nm, wherein the major emission peak has a CIE coordination (0.157, 0.667) as shown in FIG. 3. Compared to the conventional phosphor $EuMgAl_{10}O_{17}$ without dopant, the phosphors of the invention has longer emission wavelength. For example, the strongest emission intensity of $EuMg_{0.7}Mn_{0.3}Al_{10}O_{17}$ ($1*10^7$ counts.) is 100% higher than that of the $EuMgAl_{10}O_{17}$ ($5*10^6$ counts.). FIG. 4 shows the photoluminescence intensity influenced by the different Mn ratio in phosphor $EuMg_{(1-y)}Mn_yAl_{10}O_{17}$. The photoluminescence intensity is enhanced by increasing the Mn ratio until y equal to 0.3. When Mn ratio is greater than 0.3, the photoluminescence intensity is reduced by increasing the Mn ratio. Note that the phosphor corresponding to FIG. 4 is prepared at 1600° C. for 8 hours. The best Mn ratio (y) of the other $EuMg_{(1-y)}Mn_yAl_{10}O_{17}$ is determined by sintering temperature and period, not limited by the best ratio of FIG. 4.

Example 2

Figure 5:
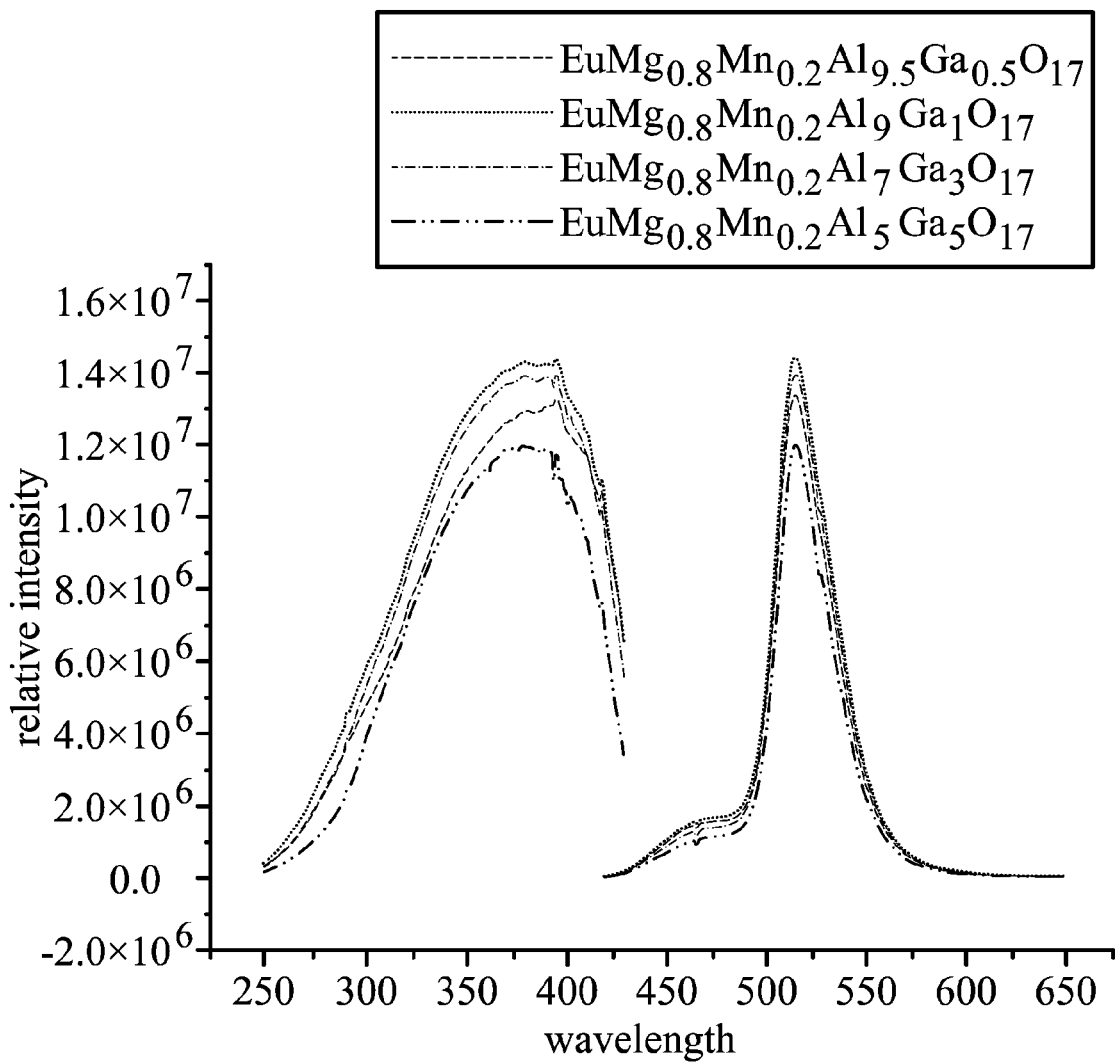
FIG. 5 shows the comparison of excitation and emission spectra between phosphors $EuMg_{0.8}Mn_{0.2}Al_{(10-z)}Ga_zO_{17}$ with different z ratio.

According to chemical stoichiometry, the appropriate amount of $Eu_2O_3$ (commercially available from Aldrich Chemicals Company Inc. in U.S.A., 99.99%, FW=351.92), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), $Al_2O_3$ (commercially available from Aldrich Chemicals Company Inc. in U.S.A., >99.9%, FW=101.96), and $Ga_2O_3$ (commercially available from Aldrich Chemicals Company Inc. in U.S.A., >99.9%, FW=187.44) were evenly mixed and grinded, charged in a crucible, and heated in a high temperature furnace. After sintering at 1600° C. for about 8 hours under 5% $H_2/N_2$, the phosphor $EuMg_{0.8}Mn_{0.2}Al_{9.5}Ga_{0.5}O_{17}$, $EuMg_{0.8}Mn_{0.2}Al_9GaO_{17}$, $EuMg_{0.8}Mn_{0.2}Al_7Ga_3O_{17}$, and $EuMg_{0.8}Mn_{02}Al_5Ga_5O_{17}$ were prepared. The excitation and emission spectra comparison of the above products was shown in FIG. 5. The described phosphors have a major excitation peak of 380 nm to 396 nm and a major emission peak of 515 nm, wherein the major emission peak has a CIE coordination (0.155, 0.615). Accordingly, the Al of $EuMg_{0.8}Mn_{0.2}Al_{10-z}Mc_zO_{17}$ can be optionally doped by other IIIA group elements (Mc) such as Ga.

Example 3

Figure 6:
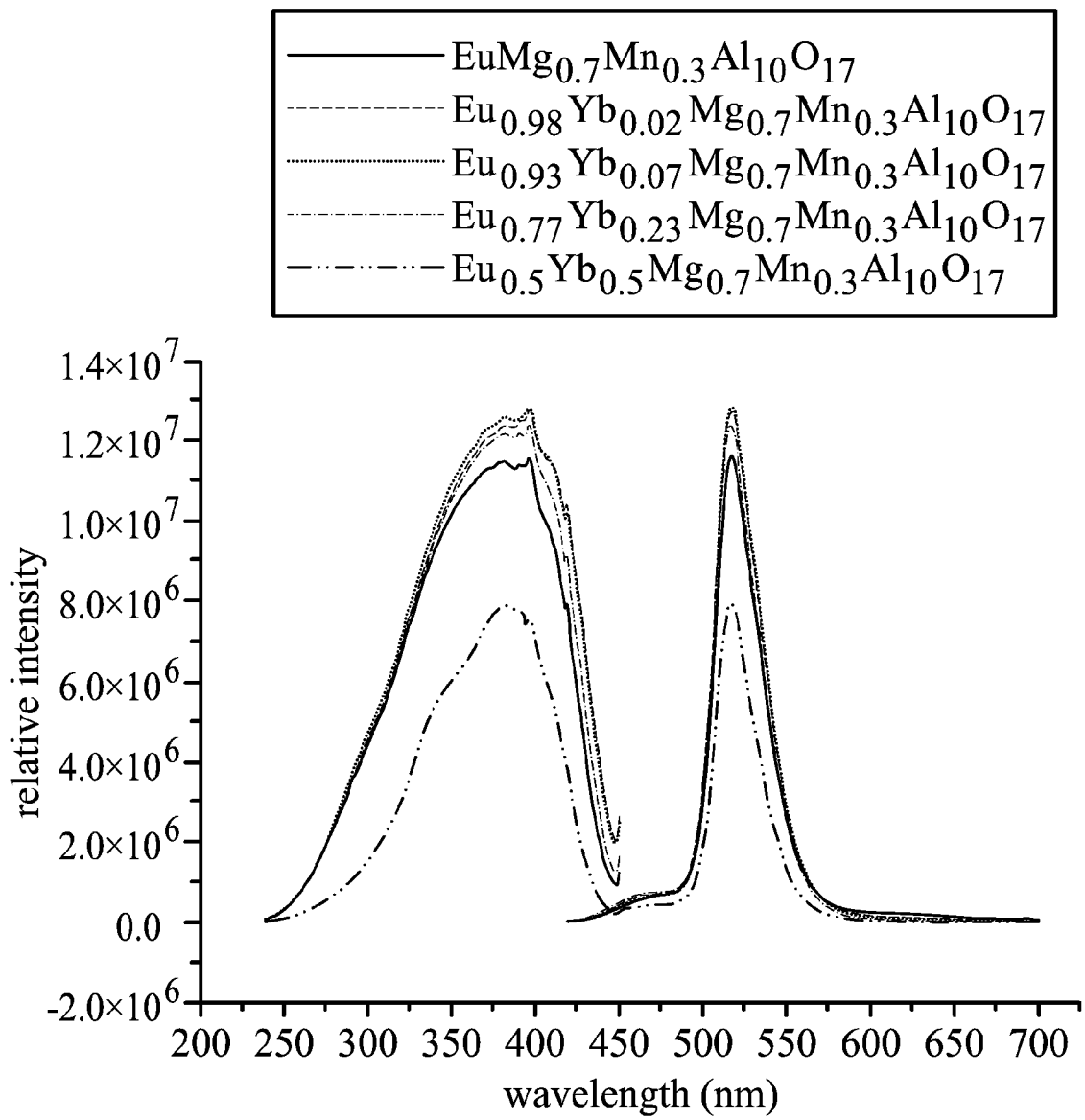
FIG. 6 shows the comparison of excitation and emission spectra between phosphors $Eu_{1-x}Yb_xMg_{0.7}Mn_{0.3}Al_{10}O_{17}$ and the phosphor $EuMg_{0.7}Mn_{0.3}Al_{10}O_{17}$.

According to chemical stoichiometry, the appropriate amount of $Eu_2O_3$ (commercially available from Aldrich Chemicals Company Inc. in U.S.A., 99.99%, FW=351.92), $Yb_2O_3$ (commercially available from PRO CHEM INC, 99.9%, FW=394), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), and $Al_2O_3$ (commercially available from Aldrich Chemicals Company Inc. in U.S.A., >99.9%, FW=101.96), were evenly mixed and grinded, charged in a crucible, and heated in a high temperature furnace. After sintering at 1600° C. for about 8 hours under 5% $H_2/N_2$, the phosphor $EuMg_{0.7}Mn_{0.3}Al_{10}O_{17}$, $Eu_{0.98}Yb_{0.02}Mg_{0.7}Mn_{0.3}Al_{10}O_{17}$, $Eu_{0.93}Yb_{0.07}Mg_{0.7}Mn_{0.3}Al_{10}O_{17}$, $Eu_{0.77}Yb_{0.23}Mg_{0.7}Mn_{0.3}Al_{10}O_{17}$, and $Eu_{0.5}Yb_{0.5}Mg_{0.7}Mn_{0.3}Al_{10}O_{17}$ were prepared. The excitation and emission comparison of the above products was shown in FIG. 6. The described phosphors have a major excitation peak of 380 nm to 396 nm and a major emission peak of 516 nm to 517 nm, wherein the major emission peak has a CIE coordination (0.163, 0.673). Accordingly, the phosphor can be doped with a little amount of Yb to enhance its emission intensity and excitation yield.

Example 4

Figure 7:
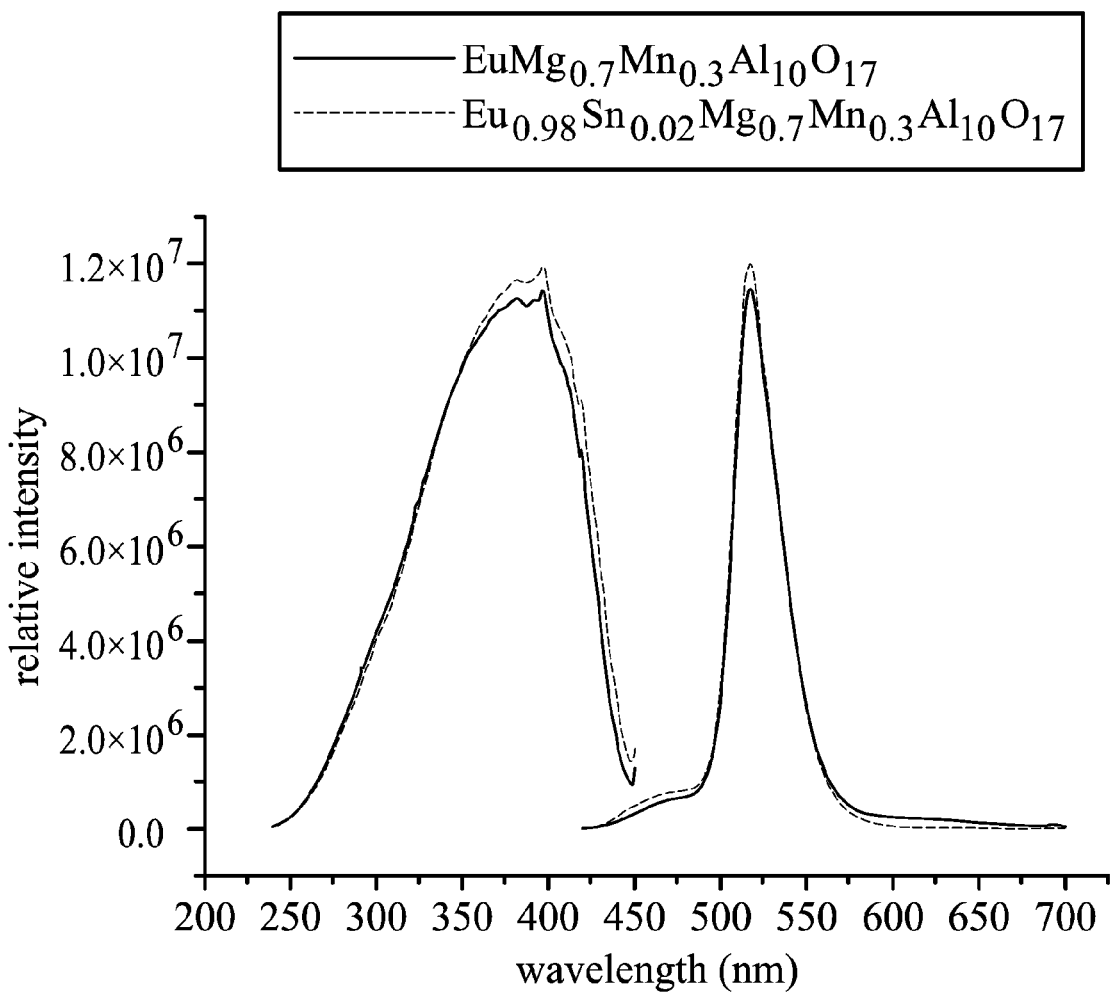
FIG. 7 shows the comparison of excitation and emission spectra between phosphors $Eu_{1-x}Sn_xMg_{0.7}Mn_{0.3}Al_{10}O_{17}$ and the phosphor $EuMg_{0.7}Mn_{0.3}Al_{10}O_{17}$.

According to chemical stoichiometry, the appropriate amount of $Eu_2O_3$ (commercially available from Aldrich Chemicals Company Inc. in U.S.A., 99.99%, FW=351.92), SnO (commercially available from PRO CHEM INC, 99.9%, FW=134.69), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), and $Al_2O_3$ (commercially available from Aldrich Chemicals Company Inc. in U.S.A., >99.9%, FW=101.96), were evenly mixed and grinded, charged in a crucible, and heated in a high temperature furnace. After sintering at 1600° C. for about 8 hours under 5% $H_2/N_2$, the phosphor $EuMg_{0.7}Mn_{0.3}Al_{10}O_{17}$ and $Eu_{0.98}Sn_{0.02}Mg_{0.7}Mn_{0.3}Al_{10}O_{17}$ were prepared. The excitation and emission comparison of the above products was shown in FIG. 7. The described phosphors have a major excitation peak of 396 nm and a major emission peak of 517 nm, wherein the major emission peak has a CIE coordination (0.152, 0.665). Accordingly, the phosphor can be doped with a little amount of Sn to enhance its emission intensity and excitation yield.

Example 5

Figure 8:
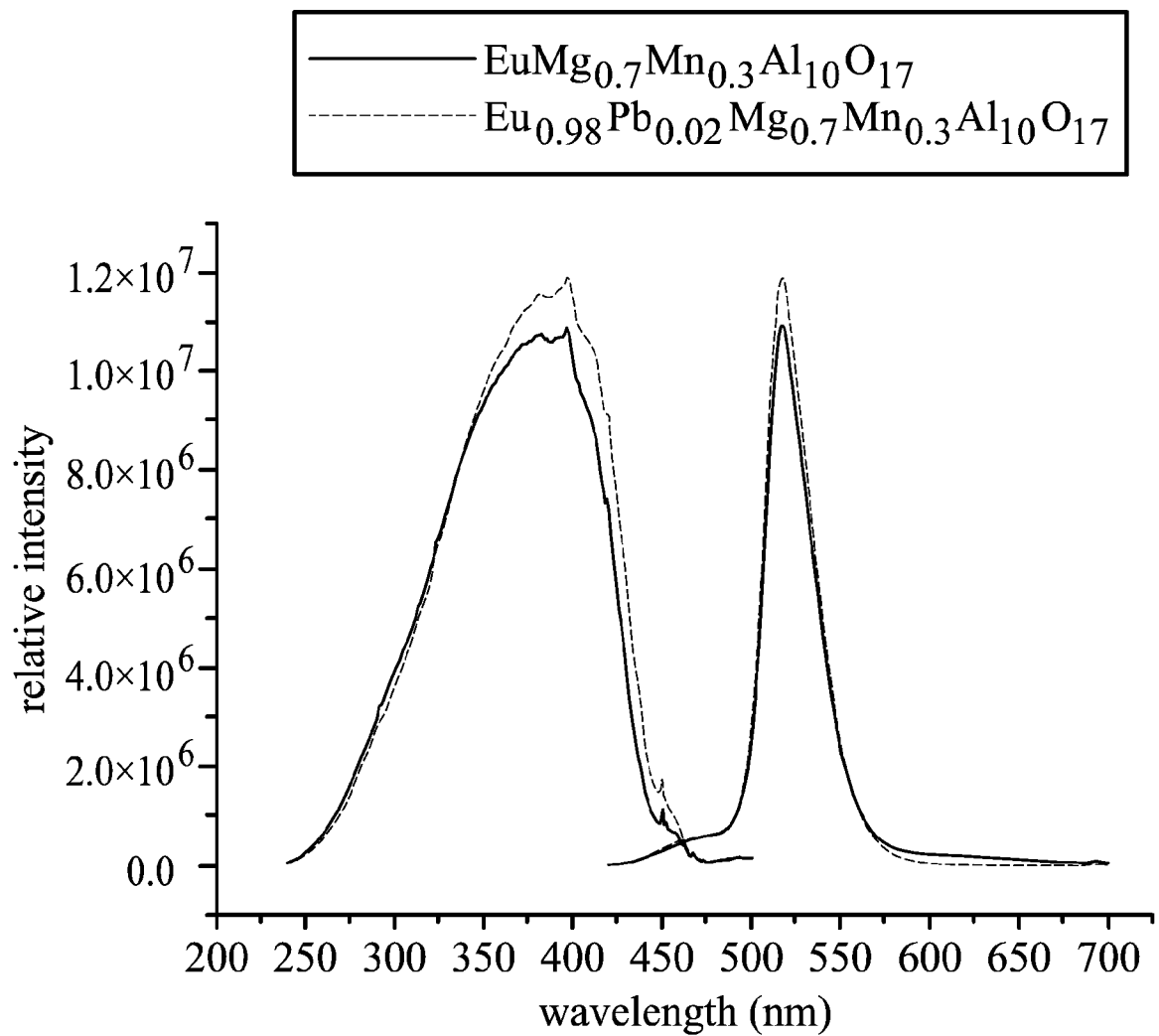
FIG. 8 shows the comparison of excitation and emission spectra between phosphors $Eu_{1-x}Pb_xMg_{0.7}Mn_{0.3}Al_{10}O_{17}$ and the phosphor $EuMg_{0.7}Mn_{0.3}Al_{10}O_{17}$.

According to chemical stoichiometry, the appropriate amount of $Eu_2O_3$ (commercially available from Aldrich Chemicals Company Inc. in U.S.A., 99.99%, FW=351.92), $Pb_3O_4$ (commercially available from SHOWA CHEMICAL, 99.9%, FW=685.6), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), and $Al_2O_3$ (commercially available from Aldrich Chemicals Company Inc. in U.S.A., >99.9%, FW=101.96), were evenly mixed and grinded, charged in a crucible, and heated in a high temperature furnace. After sintering at 1600° C. for about 8 hours under 5% $H_2/N_2$, the phosphor $EuMg_{0.7}Mn_{0.3}Al_{10}O_{17}$ and $Eu_{0.98}Pb_{0.02}Mg_{0.7}Mn_{0.3}Al_{10}O_{17}$ were prepared. The excitation and emission spectra comparison of the above products was shown in FIG. 8. The described phosphors have a major excitation peak of 396 nm and a major emission peak of 517 nm, wherein the major emission peak has a CIE coordination (0.153, 0.686). Accordingly, the phosphor can be doped with a little amount of Pb to enhance its emission intensity and excitation yield.

Example 6

Figure 9:
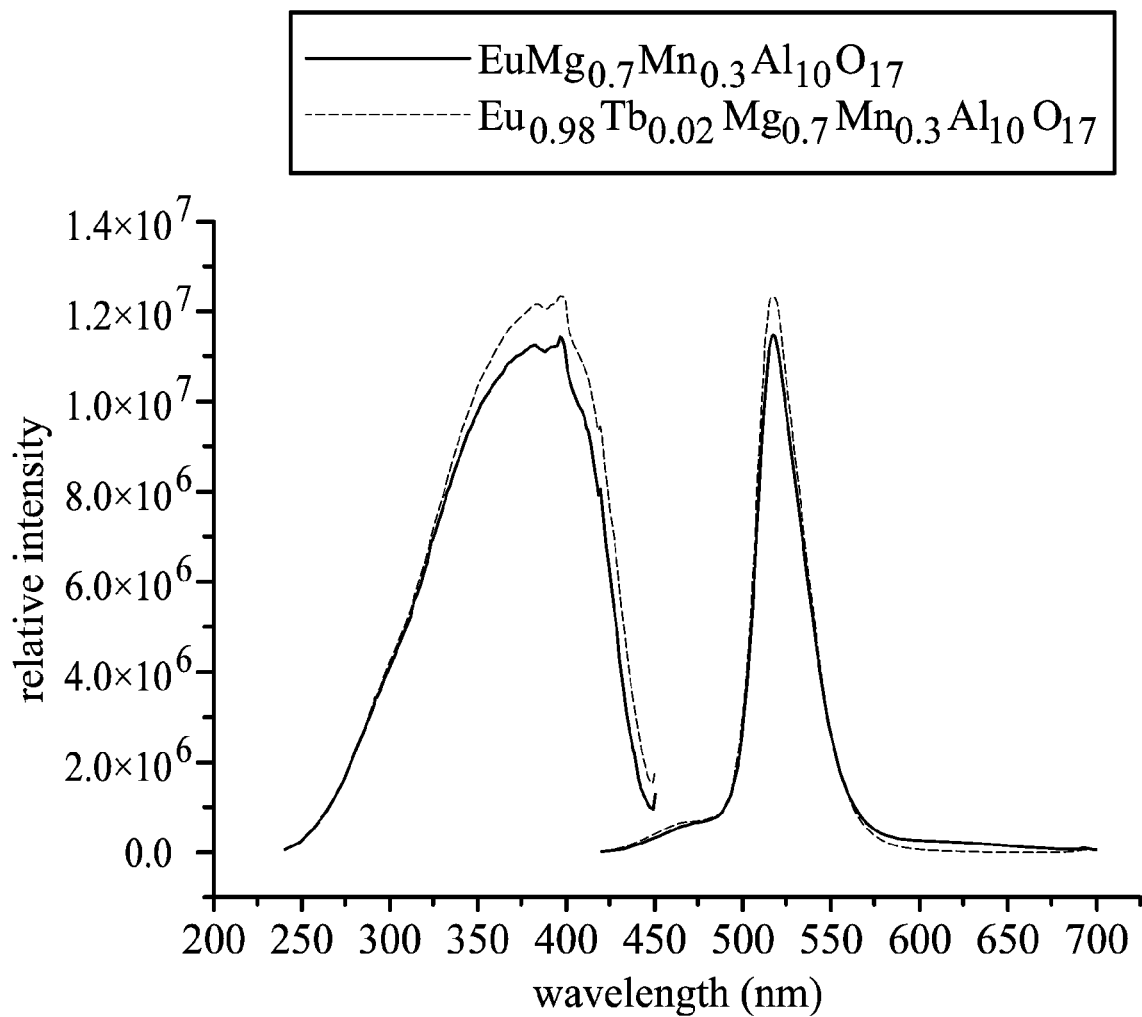
FIG. 9 shows the comparison of excitation and emission spectra between phosphors $Eu_{1-x}Tb_xMg_{0.7}Mn_{0.3}Al_{10}O_{17}$ and the phosphor $EuMg_{0.7}Mn_{0.3}Al_{10}O_{17}$.

According to chemical stoichiometry, the appropriate amount of $Eu_2O_3$ (commercially available from Aldrich Chemicals Company Inc. in U.S.A., 99.99%, FW=351.92), $Tb(NO_3)_3.5H_2O$ (commercially available from STREM CHEMICAL, 99.9%, FW=453.04), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), and $Al_2O_3$ (commercially available from Aldrich Chemicals Company Inc. in U.S.A., >99.9%, FW=101.96), were evenly mixed and grinded, charged in a crucible, and heated in a high temperature furnace. After sintering at 1600° C. for about 8 hours under 5% $H_2/N_2$, the phosphor $EuMg_{0.7}Mn_{0.3}Al_{10}O_{17}$ and $Eu_{0.98}Tb_{0.02}Mg_{0.7}Mn_{0.3}Al_{10}O_{17}$ were prepared. The excitation and emission spectra comparison of the above products was shown in FIG. 9. The described phosphors have a major excitation peak of 396 nm and a major emission peak of 517 nm, wherein the major emission peak has a CIE coordination (0.153, 0.677). Accordingly, the phosphor can be doped with a little amount of Tb to enhance its emission intensity and excitation yield.

Example 7

Figure 10:
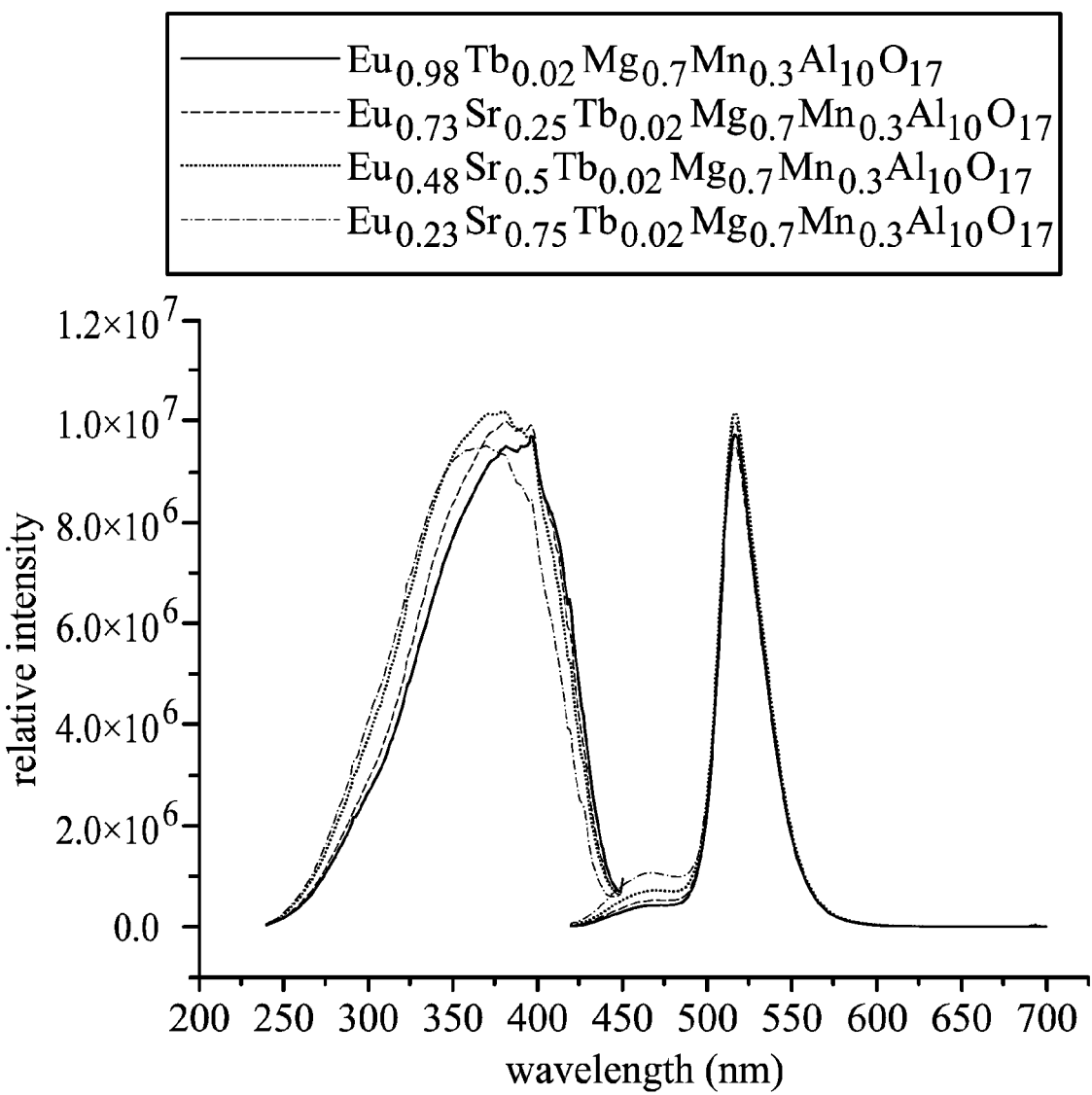
FIG. 10 shows the comparison of excitation and emission spectra between phosphors $Eu_{0.98-x}Sr_xTb_{0.02}Mg_{0.7}Mn_{0.3}Al_{10}O_{17}$ with different x ratio.

According to chemical stoichiometry, the appropriate amount of $Eu_2O_3$ (commercially available from Aldrich Chemicals Company Inc. in U.S.A., 99.99%, FW=351.92), $SrCO_3$ (commercially available from PRO CHEM INC 99.9%, FW=147.6), $Tb(NO_3)_3.5H_2O$ (commercially available from STREM CHEMICAL, 99.9%, FW=453.04), MgO (commercially available from Aldrich Chemicals Company Inc. in U.S.A., 99.99%, FW=40.3), $MnCO_3$ (commercially available from Aldrich Chemicals Company Inc. in U.S.A., 99.99%, FW=114.93), and $Al_2O_3$ (commercially available from Aldrich Chemicals Company Inc. in U.S.A., >99.9%, FW=101.96), were evenly mixed and grinded, charged in a crucible, and heated in a high temperature furnace. After sintering at 1600° C. for about 8 hours under 5% $H_2/N_2$, the phosphor $Eu_{0.98}Tb_{0.02}Mg_{0.7}Mn_{0.3}Al_{10}O_{17}$, $Eu_{0.73}Sr_{0.25}Tb_{0.02}Mg_{0.7}Mn_{0.3}Al_{10}O_{17}$, $Eu_{0.48}Sr_{0.5}Tb_{0.02}Mg_{0.7}Mn_{0.3}Al_{10}O_{17}$, and $Eu_{0.23}Sr_{0.75}Tb_{0.02}Mg_{0.7}Mn_{0.3}Al_{10}O_{17}$ were prepared. The excitation and emission spectra comparison of the above products was shown in FIG. 10. The described phosphors have a major excitation peak of 370 nm to 396 nm and a major emission peak of 516 nm, wherein the major emission peak has a CIE coordination (0.146, 0.673). Accordingly, the phosphor can be doped with multi dopants such as Sr and Tb to enhance its emission intensity and excitation yield.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor, having a formula:
$Eu_{(1-x)}Ma_xMg_{(1-y)}Mb_yAl_{(10-z)}Mc_zO_{17}$,
wherein Ma is Yb, Sn, Pb, Ce, Tb, Dy, Pr, Ca, Sr, Ba, or combinations thereof, and $0<x\leq0.9$;
Mb is Mn, Zn, or combinations thereof, and $0<y\leq0.7$; and
Mc is Ga, In, B, or combinations thereof, and $0\leq z\leq5$.

2. A phosphor, having a formula: $EuMg_{0.8}Mn_{0.2}Al_{(10-z)}Ga_zO_{17}$, wherein $0<z\leq5$.

3. The phosphor as claimed in claim 2, having a formula: $EuMg_{0.8}Mn_{0.2}Al_9GaO_{17}$, wherein the phosphor is excited by 200-400nm UV or 400-420nm blue light to emit a green light, and the green light has a major emission peak of about 517nm and a CIE coordination of (0.155, 0.615).

4. The phosphor as claimed in claim 1, wherein Mb is Mn, $Ma_x$ is $Md_pMe_q$, Md is Sn, Yb, Pb, Tb, Ce, Dy, Pr, or combinations thereof, and $0<p\leq0.5$; Me is Ca, Sr, Ba, or combinations thereof, and $0\leq q\leq0.9$; and $0<p+q0.9$.

5. The phosphor as claimed in claim 1, wherein Mb is Mn, $Ma_x$ is $Md_pMe_q$, Md is Sn, Pb, Tb, Ce, Dy, Pr, or combinations thereof, and $0<p\leq0.5$; Me is Ca, Sr, Ba, or combinations thereof, and $0\leq q\leq0.9$; and $0<p+q\leq0.9$.

6. The phosphor as claimed in claim 1, wherein Mb is Mn, Ma is Sn, Yb, Pb, Tb, Ce, Dy, Pr, or combinations thereof, and $0<x\leq0.5$.

7. A white light illumination device, comprising the phosphor as claimed in claim 1 and an excitation light source, wherein the excitation light source emits 200-400nm UV or 400-420nm blue light.

8. The white light illumination device as claimed in claim 7, wherein the excitation light source comprises a light emitting diode or a laser diode.

9. The white light illumination device as claimed in claim 7, further comprising a blue phosphor and a red phosphor.

10. The white light illumination device as claimed in claim 9, wherein the blue phosphor comprises $BaMgAl_{10}O_{17}:Eu^{2+}$, $(Ba,Sr,Ca)_5(PO_4)_3(F,Cl,Br,OH):Eu^{2+}$, $2SrO*0.84P_2O_5*0.16B_2O_3:Eu^{2+}$, $Sr_2Si_3O_8*2SrCl_2:Eu^{2+}$, or $(Mg,Ca,Sr,Ba,Zn)_3B_2O_6:Eu^{2+}$.

11. The white light illumination device as claimed in claim 9, wherein the red phosphor comprises $(Sr,Ca)S:Eu^{2+}$, $(Y,La,Gd,Lu)_2O_3:Eu^{3+},Bi^{3+}$, $(Y,La,Gd,Lu)_2O_2S:Eu^{3+},Bi^{3+}$, $Ca_2Si_5N_8:Eu^{2+}$, or ZnCdS:AgCl.

12. A solar cell, comprising:
a transparent substrate;
an anode and a cathode on the bottom surface of the transparent substrate; and
a semiconductor layer between the anode and the cathode;
wherein the top surface of the transparent substrate has the phosphor as claimed in claim 1.

13. A white light illumination device, comprising the phosphor as claimed in claim 2 and an excitation light source, wherein the excitation light source emits 200-400nm UV or 400-420nm blue light.

14. The white light illumination device as claimed in claim 13, wherein the excitation light source comprises a light emitting diode or a laser diode.

15. The white light illumination device as claimed in claim 13, further comprising a blue phosphor and a red phosphor.

16. The white light illumination device as claimed in claim 15, wherein the blue phosphor comprises $BaMgAl_{10}O_{17}:Eu^{2+}$, $(Ba,Sr,Ca)_5(PO_4)_3(F,Cl,Br,OH):Eu^{2+}$, $2SrO*0.84P_2O_5*0.16B_2O_3:Eu^{2+}$, $Sr_2Si_3O_8*2SrCl_2:Eu^{2+}$, or $(Mg,Ca,Sr,Ba,Zn)_3B_2O_6:Eu^{2+}$.

17. The white light illumination device as claimed in claim 15, wherein the red phosphor comprises $(Sr,Ca)S:Eu^{2+}$, $(Y,La,Gd,Lu)_2O_3:Eu^{3+},Bi^{3+}$, $(Y,La,Gd,Lu)_2O_2S:Eu^{3+},Bi^{3+}$, $Ca_2Si_5N_8:Eu^{2+}$, or ZnCdS:AgCl.

* * * * *